United States Patent
Sievers et al.

(10) Patent No.: US 8,837,795 B2
(45) Date of Patent: Sep. 16, 2014

(54) MICROSCOPY OF SEVERAL SAMPLES USING OPTICAL MICROSCOPY AND PARTICLE BEAM MICROSCOPY

(71) Applicant: Carl Zeiss Microscopy GmbH, Jena (DE)

(72) Inventors: Torsten Sievers, Heidenheim an der Brenz (DE); Michael Kieweg, Heidenheim an der Brenz (DE)

(73) Assignee: Carl Zeiss Microscopy GmbH, Jena (DE)

( * ) Notice: Subject to any disclaimer, the term of this patent is extended or adjusted under 35 U.S.C. 154(b) by 146 days.

(21) Appl. No.: 13/655,094

(22) Filed: Oct. 18, 2012

(65) Prior Publication Data
US 2013/0101188 A1 Apr. 25, 2013

(30) Foreign Application Priority Data
Oct. 19, 2011 (DE) .......... 10 2011 084 829

(51) Int. Cl.
*G06K 9/00* (2006.01)
*H01J 37/22* (2006.01)
*H01J 37/26* (2006.01)
*G06N 7/00* (2006.01)
*G06K 9/36* (2006.01)

(52) U.S. Cl.
CPC ......... *H01J 37/222* (2013.01); *H01J 2237/221* (2013.01); *H01J 2237/2482* (2013.01); *H01J 37/226* (2013.01); *H01J 37/26* (2013.01)
USPC ............ 382/128; 382/287; 250/304; 250/311

(58) Field of Classification Search
None
See application file for complete search history.

(56) References Cited

U.S. PATENT DOCUMENTS

| 5,636,255 | A | 6/1997 | Ellis |
| 5,905,266 | A | 5/1999 | Lardiunat et al. |
| 6,141,464 | A | 10/2000 | Handley |
| 6,683,316 | B2 | 1/2004 | Schamber et al. |
| 2003/0021381 | A1 | 1/2003 | Koppe et al. |
| 2003/0139663 | A1 | 7/2003 | Graumann |

(Continued)

FOREIGN PATENT DOCUMENTS

| DE | 102009020663 A1 | 11/2010 |
| EP | 0849765 A2 | 6/1998 |
| WO | WO 2010133982 A2 | 11/2010 |

OTHER PUBLICATIONS

Lee et al "Learning Similarity Measure for multi-modal 3d image registration", Computer Vision and Pattern Recognition—CVPR, pp. 186-193, 2009.*

(Continued)

*Primary Examiner* — Amara Abdi
(74) *Attorney, Agent, or Firm* — Patterson Thuente Pedersen, P.A.

(57) ABSTRACT

A method for the microscopy of samples using optical microscopy and particle beam microscopy provides that the samples are divided into a partial quantity and a residual quantity and the samples of the partial quantity are prepared to contain registration marks. The samples of the partial quantity are imaged using optical microscopy and particle beam microscopy, with the result that a pair of optical microscopy images and particle beam microscopy images is obtained for each sample of the partial quantity. The pairs are position-registered relative to each other using the registration marks. The images of the position-registered pairs are modified by removing the registration marks. A registration algorithm is trained which evaluates the image contents and issues a quality measure for a position registration of each pair. The objects of the residual quantity are imaged. These pairs are position-registered by the trained registration algorithm to maximize the quality measure.

6 Claims, 1 Drawing Sheet

(56) References Cited

U.S. PATENT DOCUMENTS

| | | | |
|---|---|---|---|
| 2006/0118733 A1 | 6/2006 | Kiyohara et al. | |
| 2008/0308731 A1 | 12/2008 | Nishiyama et al. | |
| 2012/0069167 A1 | 3/2012 | Liu et al. | |
| 2012/0133757 A1* | 5/2012 | Thomas et al. | 348/80 |

OTHER PUBLICATIONS

Daewon Lee et al., "Learning Similarity Measure for Multi-Modal 3D Image Registration", Computer Vision and Pattern Recognition, pp. 186-193, 2009.

A.B. Abche et al., "A New Method for Multimodal 3-D Image Registration with External Markers", Nuclear Science Symposium and Medical Imaging Conference, pp. 1822-1826, 1994.

S. Preibisch et al., "Bead-based Mosaicing of Single Plane Illumination Microscopy Images using Geometric Local Descriptor Matching", SPIE Medical Imaging Conference, 4 pages, 2009.

M.S. Lucas et al., "Correlative 3D microscopy: CLSM and FIB/SEM tomography used to study cellular entry of vaccinia virus", A. Aretz et al. (Eds.): EMC 2008, vol. 3: Life Science, pp. 361-362, Springer-Verlag Berlin Heidelberg 2008.

* cited by examiner

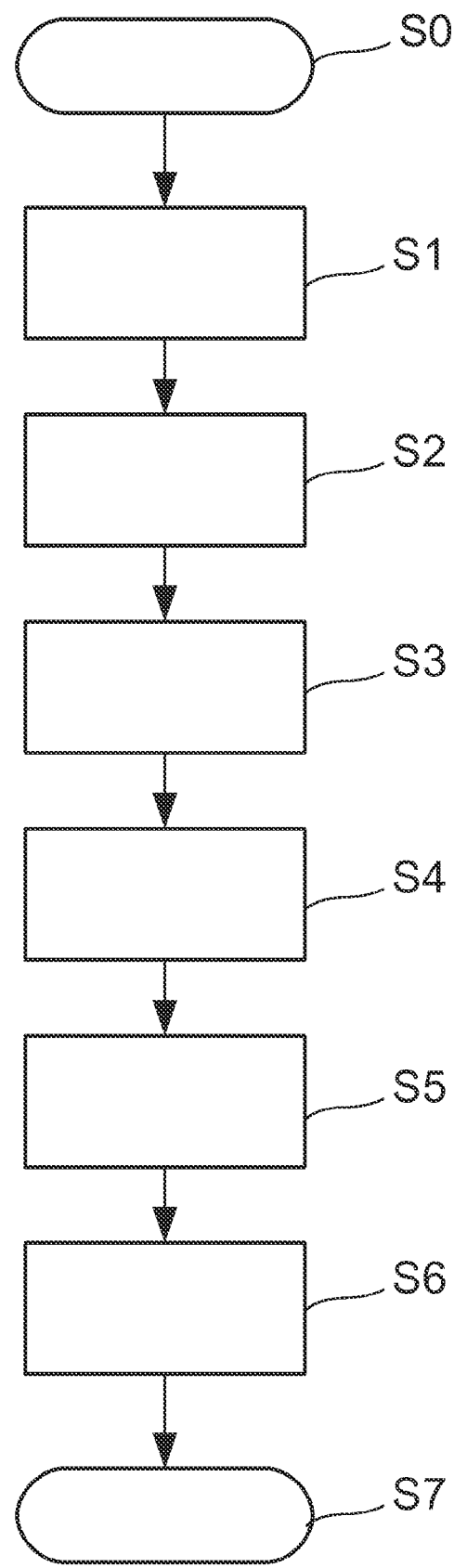

MICROSCOPY OF SEVERAL SAMPLES USING OPTICAL MICROSCOPY AND PARTICLE BEAM MICROSCOPY

CLAIM TO PRIORITY

This application claims the benefit of German Patent Application DE 102011084829.0 filed Oct. 19, 2011 the entire contents of which are incorporate by reference herein.

FIELD OF THE INVENTION

The invention relates to a method for the microscopy of several samples using optical microscopy and particle beam microscopy.

BACKGROUND

By optical microscopy is meant within the meaning of this description a microscopy method which for imaging uses radiation obeying the laws of optics, in particular in the visible range, i.e. light. Particle beam microscopy within the meaning of this description is when an imaging takes place by means of a beam of charged particles, for example in the form of electron beam microscopy. Where light microscopy or electron beam microscopy are mentioned in this description, these are to be understood purely as exemplifying optical microscopy or particle beam microscopy, respectively.

For biological and material-science objects in particular, an examination using both optical microscopy, e.g. light microscopy, and particle beam microscopy, e.g. electron microscopy, is often desirable. In the state of the art complex microscopes which can carry out both microscopy methods are used for this. One such microscope is known for example from EP 0849765 A2 or U.S. Pat. No. 6,683,316 B2. Such combination microscopes are complex in particular because the whole of the optical microscope has to be integrated into the vacuum chamber which is required for the particle beam microscopy, and a sample table which moves a sample between the two microscopes under a vacuum has to be provided. This results in a relatively large vacuum volume and in addition significant outlay when manufacturing the optical microscope, which then has to be suitable for use under a vacuum. If the object is not arranged under a vacuum during the particle beam microscopy, as e.g. in the combination microscope according to US 20080308731 A1, the imaging quality suffers, as the electrons are scattered on a membrane as well as in air.

An alternative to the use of such combination microscopes is the sequential use of single devices. This is known for example from the publication by: M. S. Lucas, P. Gasser, M. Günthert, J. Mercer, A. Helenius and R. Wepf: Correlative 3D microscopy: LSM and FIB/SEM tomography used to study cellular entry of *vaccinia* virus, A. Aretz, B. Hermanns-Sachweh, J. Mayer (Eds.): EMC 2008, Vol. 3: Life Science, pp. 361-362, Springer-Verlag Berlin Heidelberg 2008. There, the optical imaging of the sample for example using confocal laser scanning microscopy takes place first. Then it is attempted to capture a picture of the sample region already optically imaged in this way (also called region of interest—ROI) using an electron microscope. The imaging of the usually bulky sample is carried out by removing layers of the sample by means of a focused ion beam and imaging it using the electron microscope.

The sequential use of the confocal laser scanning microscope and the electron beam microscope has the disadvantage that the position, in particular the axial position, of the sample region examined under the respective microscope cannot be exactly correlated with the corresponding position of the examination under the other microscope.

DE 102009020663 from Carl Zeiss AG therefore provides a corresponding slide with which the sample can be examined using both optical microscopy and particle beam microscopy without being removed from the slide. However, the desired correlation of the respectively obtained data requires the special slide.

If it is desired to dispense with this, an optical microscopy image has to be registered corresponding to the particle beam microscopy image. For this, the following approaches are known:

The position of the images relative to each other can be adjusted by an operator. A manual registration of the two images is thus effected. For one thing, the manual registration is very laborious. For another thing, it is not practicable for 3D data sets because the representation of the images is usually two-dimensional. The main disadvantage of such an approach, however, is that the user has to input knowledge about the local correlation of the two pictures in order to register the images. Thus the actual aim of obtaining knowledge about the spatial correlation from the two images cannot be achieved.

A learning method which, with the help of manually pre-registered image data, learns which image contents belong together is known from the publication by D. Lee et al., "Learning Similarity Measure for multi-modal 3d image registration", Computer Vision and Pattern Recognition—CVPR, pp. 186-193, 2009. The method provides a similarity measure for the registration, once the algorithm has gone through the corresponding learning process. The problem with the algorithm to be trained, according to the publication by Lee et al., is that a data set with pre-registered images is needed. Thus knowledge of the local correlation of the two pictures is again necessary in order to be able to effect the pre-registration.

A registration is also possible by preparing the sample such that it contains registration marks which are visible with both microscopy methods, i.e. with optical microscopy and with particle beam microscopy. These marks are aligned during the registration. The disadvantage of a sample preparation with registration marks is the outlay associated with it. The concentration of such marks is important for the registration, and the sample must be suitable for the marks. Registration marks also have the disadvantage that they are naturally very visible in both the optical and the particle beam microscopy image and thus sometimes disrupt further examinations of the sample.

In principle, standard methods for image processing, such as cross-correlation or simple difference methods, are also conceivable. However, they suffer from the problem that light microscopes often image, with a good contrast, completely different structures to electron microscopes. Thus, in bioengineering, a light microscope usually delivers information about the course of biological processes, whereas an electron microscope images the physical structure of biological materials. The named standard methods for image processing as a rule cannot therefore be used to advantage.

The object of the invention is therefore to develop a method for the microscopy of several samples using optical microscopy and particle beam microscopy such that optical microscopy images and particle beam microscopy images for each sample can be position-registered relative to each other with a small outlay and, at the same time, a good result.

This object is achieved according to the invention by a method for the microscopy of several samples using optical microscopy and particle beam microscopy, wherein a) the samples are divided into a partial quantity and a residual quantity,
b) the samples of the partial quantity are prepared such that they contain registration marks which are visible in both optical microscopy and particle beam microscopy,
c) the samples of the partial quantity are imaged using optical microscopy and particle beam microscopy, with the result that a pair consisting of optical microscopy image and particle beam microscopy image is obtained for each sample of the partial quantity,
d) the pairs consisting of optical microscopy image and particle beam microscopy image are position-registered relative to each other using the registration marks,
e) the optical microscopy images and the particle beam microscopy images of the position-registered pairs are modified by removing the registration marks from the images,
f) using the modified optical microscopy images and particle beam microscopy images of the position-registered pairs, a registration algorithm is trained which evaluates the image contents and issues a quality measure for a position registration of each of the pairs, and
g) the objects of the residual quantity without registration marks are imaged using optical microscopy and particle beam microscopy, with the result that a pair consisting of optical microscopy image and particle beam microscopy image is also obtained for each sample of the residual quantity, and these pairs are position-registered relative to each other with the help of the trained registration algorithm by moving the images of each pair opposite one another in order to maximize the quality measure issued by the trained registration algorithm for the respective pair.

The method thus uses registration marks for the partial quantity of the samples which marks allow to register the images of the image pairs relative to each other for these partial quantities of the samples. For this, the named methods from the state of the art can be used. A registration algorithm is then trained with these images, the position registration of which has been carried out.

By registration is meant here the process of aligning two images of the same sample with respect to their coordinates systems such that they match as well as possible when superimposed. For example position information is obtained which indicates the same regions of the sample in the two images of the image pairs, for example by suitable coordinate data, etc.

The aim during the image registration is to find a transformation which matches one image, e.g. the optical microscopy image, as well as possible to the other image, e.g. the particle beam image. The best possible match is characterized by a measure of whether the images are identical or different. As a rule, the transformation brings the two images into a common coordinates system (cf. also http://de.wikipedia.org/wiki/Bildregistrierung and http://en.wikipedia.org/wiki/Image_registration).

In order that the registration algorithm does not also learn the registration marks present, the images are modified before the training by removing the registration marks. The registration algorithm therefore learns on the basis of the image contents without the registration marks. With the registration algorithm trained in this way, the remaining samples can then also be position-registered relative to each other until they are in a relative position in which the quality measure issued by the trained registration algorithm is maximized.

In principle, any method which derives a registration measure from image contents can be used as registration algorithm. In particular, the registration algorithm according to the named publication by Lee et al. can be used.

Of course, the more similar the samples are with respect to their image content, the better the result of the trained registration algorithm is. The method is therefore particularly suitable for series samples which originate from one and the same object, for example in the form of thin sections, such as are named in the mentioned DE 102009020663 A1. However, samples which originate from similar objects, for example the same biological structure, for example the same tissue, or from an identical production process, etc., can also be used.

It is essential for the method that the registration marks are removed from the image data before the training of the registration algorithm. This can be carried out particularly simply by segmenting the images accordingly and cutting out the image constituents which contain the registration marks. Similarly, it is possible to interpolate the image constituents or replace them with neutral image information, thus to cover the registration marks.

Since the registration algorithm, as a digital image processing method, provides a particularly good result if the image quality is high, it is preferable to subject the optical microscopy images and the particle beam microscopy images to a denoising processing step and/or a contrast-increasing step before the registration algorithm is trained on the position-registered image pairs.

The method automates the registration of image pairs consisting of optical microscopy and particle beam microscopy. The automation is, naturally, advantageous particularly when a plurality of images or large quantities of data are to be processed. This is the case if the optical microscopy images and/or the particle beam microscopy images are 3D images.

In modern microscopes, the precision of the positioning of slides is well below the pixel precision of the imaging. The registration therefore supplements the slide positioning with a precision that goes beyond the mere detection of marks on a slide.

By registration marks are meant here structures which are visible in both images. During the sample preparation, it is ensured that the samples of the partial quantity contain such registration marks. Such registration marks are usually added during the sample preparation. However, it is also possible to select a microscopy object in which a partial quantity of the samples displays structures which can serve as registration marks. The same applies to removing structures inherent to the samples during the preparation of a partial quantity of the samples.

It is understood that the features mentioned above and those yet to be explained below can be used, not only in the stated combinations, but also in other combinations or alone, without departing from the scope of the present invention.

BRIEF DESCRIPTION OF THE DRAWING

The invention is explained in further detail below by way of example with reference to the attached drawing.

The FIGURE depicts a flowchart of a method for the microscopy of several samples using optical microscopy and particle beam microscopy.

DETAILED DESCRIPTION

The method begins in a step S0. Several samples are provided which are to be examined using both optical microscopy and particle beam microscopy. Not all of the samples need necessarily be available at the start of the method. It is the case that only some of the samples are available at the beginning of the method in particular when a series examination of similar values, e.g. those in a production process, etc., is to be carried out.

Some of the samples are then prepared such that they are provided with registration marks which are visible in both optical microscopy and particle beam microscopy. Such registration marks are suitable in particular for fluorescence microscopy and are here referred to as so-called fluorescent beads. At the end of this step S1, a partial quantity of the samples is present which are provided with the registration marks. Also at this point, the total quantity of the samples need not yet be available.

In a following step S2, at least the partial quantity of the samples which are provided with the registration marks is imaged using both light microscopy and electron beam microscopy. This step S2 thus results, for each sample of the partial quantity, in an image pair which consists of optical microscopy image and particle beam microscopy image.

In each image pair which is provided with the registration marks, the optical microscopy image is now position-registered relative to the particle beam microscopy image in a step S3. By this is meant that position information is obtained which indicates the same regions of the sample in the two images of the image pair, for example by suitable coordinate data, etc.

Now, in a step S4, the images of the image pairs registered in this way are modified by removing the image information about the registration marks from the images of the registered image pairs. The registration marks are thus no longer contained in the modified optical microscopy images and particle beam microscopy images. This can be carried out for example by segmenting the images and cutting out the image information about the registration marks which usually amount to only a few pixels. It is also possible to overwrite the points at which the registration marks are located with neutral image information, or to overwrite the registration marks in the image by means of interpolation using the image information of neighbouring image constituents.

As a result of this step S4, image pairs with modified optical microscopy images and particle beam microscopy images are present which are position-registered relative to each other and no longer contain registration marks.

A registration algorithm, e.g. the one known from the named publication by Lee et al., is now trained in a step S5 with these modified images. The necessary requisites for this are to hand: several pairs each consisting of two images which are position-registered relative to each other are present.

In step S6 the remaining samples are also position-registered relative to each other with the registration algorithm trained in this way. A relative position is ascertained in which the quality measure issued by the trained registration algorithm is maximized.

It is not strictly necessary (even if it is possible) to subject the rest of the samples to step S2 at a time before steps S3 to S5 have been carried out. Rather, the method is suitable to adequately train the algorithm on a partial quantity of the samples first, thus to carry out steps S1 to S5 with the partial quantity, and then to continuously examine further samples under a microscope (step S2) and register them with respect to their position (step S6), without laborious manual registrations or sample preparations with registration marks being needed for this residual quantity of the samples.

A step S7 concludes the method.

The present invention may be embodied in other specific forms without departing from the spirit of the essential attributes thereof; therefore, the illustrated embodiments should be considered in all respects as illustrative and not restrictive, reference being made to the appended claims rather than to the foregoing description to indicate the scope of the invention.

The invention claimed is:

1. A method for microscopy of several samples using optical microscopy and particle beam microscopy, comprising:
   a) dividing the samples into a partial quantity and a residual quantity,
   b) preparing the samples of the partial quantity such that they contain registration marks which are visible in both optical microscopy and particle beam microscopy,
   c) imaging the samples of the partial quantity using optical microscopy and particle beam microscopy, with the result that a pair consisting of optical microscopy image and particle beam microscopy image is obtained for each sample of the partial quantity,
   d) positioning registering pairs consisting of an optical microscopy image and a particle beam microscopy image relative to each other using the registration marks,
   e) modifying the optical microscopy images and the particle beam microscopy images of the position-registered pairs by removing the registration marks from the images,
   f) training a registration algorithm which evaluates image contents and issues a quality measure for a position registration of each of the pairs using the modified optical microscopy images and the modified particle beam microscopy images of the position-registered pairs, and
   g) imaging the samples of the residual quantity having no registration marks using optical microscopy and particle beam microscopy, with the result that a pair including an optical microscopy image and a particle beam microscopy image is also obtained for each sample of the residual quantity, and position-registering these pairs relative to each other with the help of the trained registration algorithm by moving the images of each pair opposite one another to maximize the quality measure issued by the trained registration algorithm for the respective pair.

2. The method according to claim 1, further comprising, in step e), segmenting the optical microscopy images and the particle beam microscopy images and cutting out image constituents which contain the registration marks.

3. The method according to claim 2, further comprising replacing or overwriting removed image constituents by an interpolation of surrounding image elements.

4. The method according to claim 1, further comprising subjecting the optical microscopy images and the particle beam microscopy images to a denoising processing step before step f).

5. The method according to claim 1, further comprising subjecting the optical microscopy images and the particle beam microscopy images to a contrast-increasing step before step f).

6. The method according to claim 1, wherein the optical microscopy images and/or the particle beam microscopy images are 3D images.

* * * * *